United States Patent [19]
Lien

[11] Patent Number: 5,804,477
[45] Date of Patent: Sep. 8, 1998

[54] METHOD OF MAKING A 6-TRANSISTOR COMPACT STATIC RAM CELL

[75] Inventor: Chuen-Der Lien, Los Altos Hills, Calif.

[73] Assignee: Integrated Device Technology, Inc., Santa Clara, Calif.

[21] Appl. No.: 804,764

[22] Filed: Feb. 24, 1997

[51] Int. Cl.$^6$ ............................................. H01L 21/8244
[52] U.S. Cl. ........................... 438/210; 438/231; 438/279
[58] Field of Search ..................... 438/210, 231, 438/232, 238, 279

[56] References Cited

U.S. PATENT DOCUMENTS

| | | | |
|---|---|---|---|
| 4,740,825 | 4/1988 | Saeki | 357/41 |
| 4,823,314 | 4/1989 | Sharp | 365/51 |
| 5,016,217 | 5/1991 | Brahmbhatt | 365/185 |
| 5,072,286 | 12/1991 | Minami et al. | 357/45 |
| 5,134,581 | 7/1992 | Ishibashi et al. | 365/181 |
| 5,225,693 | 7/1993 | Hirayama | 257/204 |
| 5,298,782 | 3/1994 | Sundaresan | 257/393 |
| 5,310,694 | 5/1994 | Houston | 437/52 |
| 5,334,861 | 8/1994 | Pfiester et al. | 257/67 |

OTHER PUBLICATIONS

Wolf, S. *Silicon Processing for the VLSI Era vol. 2: Process Integration* pp. 389–392, (1990).

*Primary Examiner*—Chandra Chaudhari
*Attorney, Agent, or Firm*—Skjerven, Morrill, MacPherson, Franklin & Friel

[57] ABSTRACT

A 6-T SRAM cell having a MOS transistor with source/drain regions having an absence of heavily doped portions characteristic of prior art lightly doped drain (LDD) MOS devices is fabricated. Forming the MOS transistor with an absence of heavily doped portions of source/drain regions allows the width of the MOS gate layer, the width of the MOS source/drain regions and the width of the field oxide region between active regions of the SRAM cell to be reduced compared to the prior art. Accordingly, the present SRAM cell occupies less chip area than a prior art SRAM cell. Further, forming the MOS transistor without heavily doped portions of source/drain regions improves latch-up immunity and decreases write cycle time of the present SRAM cell.

18 Claims, 8 Drawing Sheets

METHOD OF MAKING A 6-TRANSISTOR COMPACT STATIC RAM CELL

BACKGROUND OF THE INVENTION

1. Field of the Invention

This invention relates to semiconductor devices and more particularly to a method of fabricating a six transistor SRAM cell and the resulting SRAM cell structure.

2. Description of the Prior Art

As is well known in the art, all metal oxide semiconductor (MOS) static random access memories (SRAMs) have in common a basic cell consisting of two transistors and two load elements in a flip-flop configuration, together with two select transistors.

FIG. 1 is a schematic circuit diagram of a six transistor (6-T) SRAM cell 1 in the prior art. SRAM cell 1 includes N type MOS (NMOS) transistors N1 and N2 (hereinafter transistors N1 and N2) coupled between $V_{SS}$ (typically ground) and nodes A and B, respectively. Nodes A and B are further coupled to $V_{DD}$ (typically 5.0 volts (V) or 3.3 V) by pullup P type MOS (PMOS) transistors P1 and P2 (hereinafter transistors P1 and P2), respectively. Node A is further coupled to the gates of transistors P2 and N2 and node B is similarly coupled to the gates of transistors P1 and N1.

Information is stored in SRAM cell 1 in the form of voltage levels in the flip-flop formed by the two cross-coupled inverters 2 and 3 formed by transistors P1, N1 and P2, N2, respectively. In particular, when node A is at a logic low state (the voltage of node A being approximately equal to $V_{SS}$), transistor P2 is on (in a low resistance state or conducting) and transistor N2 is off (in a high resistance state or non conducting). When transistor P2 is on and transistor N2 is off, node B is at a logic high state (the voltage of node B is pulled up to approximately $V_{DD}$). Further, when node B is at a logic high state, transistor P1 is off and transistor N1 is on. When transistor P1 is off and transistor N1 is on, node A is at a logic low state (the voltage of node A is pulled down to approximately $V_{SS}$). In this manner, SRAM cell 1 remains in a latched state.

Nodes A and B are further coupled to a Bit line and a $\overline{\text{Bit}}$ line by NMOS select transistors N3 and N4 (hereinafter transistors N3 and N4), respectively. The gates of transistors N3 and N4 are coupled to a word line to enable read and write operations as those skilled in the art will understand.

One important characteristic of an SRAM cell is its size (surface area on an integrated circuit chip). Generally, it is desirable to reduce the size of the SRAM cell thereby allowing a higher density SRAM to be fabricated. Referring to FIG. 1, to fabricate a conventional 6-T SRAM cell, NMOS transistors N1, N2, N3, N4 and PMOS transistors P1, P2 are fabricated in a semiconductor substrate, typically silicon.

FIG. 2 is a cross-sectional view of a conventional lightly doped drain (LDD) complimentary metal oxide semiconductor (CMOS) structure 4 used in conventional 6-T SRAM cells. As shown in FIG. 2, a P-well 5 and an N-well 6 are formed in a semiconductor substrate 7. Formed at the surface of substrate 7 are field oxide regions 8. Formed above P-well 5 and N-well 6 are gate oxide layers 9.

Formed over gate oxide layers 9 are conductive gates 10 of NMOS transistor 11 and PMOS transistor 12. As shown in FIG. 2, LDD N type source/drain regions 13 of NMOS transistor 11 consist of N− lightly doped source/drain regions 14 laterally aligned (self aligned) to gate 10 and N+ heavily doped source/drain regions 15 laterally aligned (self aligned) to sidewall spacers 16. Similarly, LDD P type source/drain regions 17 of PMOS transistor 12 consist of P− lightly doped source/drain regions 18 laterally aligned (self aligned) to gate 10 and P+ heavily doped source/drain regions 19 laterally aligned (self aligned) to sidewall spacers 16.

CMOS structure 4 requires the formation of N type and P type active regions (field oxide regions 8 define the active regions, i.e. the active regions are in between field oxide regions 8) in the semiconductor substrate and also requires formation of field oxide regions 8 between the active regions to electrically isolate the active regions from one another. Each of the regions require a certain amount of chip area.

One method of reducing the size of an SRAM cell is to substitute a four transistor, two resistor SRAM cell (4-T, 2-R SRAM cell). As is well known to those skilled in the art, in a 4-T, 2-R SRAM cell, transistors P1 and P2 (FIG. 1) are replaced with resistor loads (not shown). However, as higher DC current is drawn through the resistor load (as compared to the PMOS transistor P1 or P2) of the invertor 2 or 3 having its NMOS transistor N1 or N2 on, respectively, 4-T, 2-R SRAM cells consume a large amount of standby power compared to 6-T SRAM cells. Yet, it is desirable to minimize the standby power consumed by an SRAM cell.

Another method to reduce the size of an SRAM cell is to fabricate a thin-film transistor (TFT) SRAM cell in which the PMOS transistors (P1 and P2 of FIG. 1) are stacked in a polysilicon interconnect layer, as is well known to those skilled in the art. Although TFT SRAM cells consume less standby power than 4-T, 2-R SRAM cells, TFT SRAM cells still consume more standby power than 6-T SRAM cells. Further, fabrication of a TFT SRAM cell requires additional processing steps compared to a 6-T SRAM cell thereby adding to the complexity and cost of fabricating the SRAM.

Accordingly, there is needed a relatively simple method of fabricating low power 6-T SRAM cells which occupy less chip area.

SUMMARY OF THE INVENTION

In accordance with one embodiment of the present invention, a 6-T SRAM cell includes an MOS transistor having a source region and a drain region in a first semiconductor region in a semiconductor substrate. The source region and the drain region have a first conductivity type and the first semiconductor region has a second conductivity type opposite the first conductivity type. The first semiconductor region has a first dopant concentration, the source region and the drain region have a second dopant concentration wherein the second dopant concentration is in a range of the first dopant concentration to 2.5 times the first dopant concentration.

In accordance with this embodiment, the MOS transistor has a gate, the source region being laterally aligned to a first edge of the gate and the drain region being laterally aligned to a second edge of the gate. A first sidewall spacer is formed adjacent the first edge of the gate and a second sidewall spacer is formed adjacent the second edge of the gate.

Of importance, the MOS transistor is formed without heavily doped portions of source/drain regions characteristic of lightly doped drain (LDD) MOS devices. Forming the first MOS transistor with an absence of heavily doped portions of source/drain regions provides several advantages.

One advantage is that the width of the drain depletion layer is reduced. This allows the width of the MOS gate to be reduced and also the width of the field oxide region between active regions of the SRAM cell to be reduced. Another advantage is that the width of each of the source/drain regions can be reduced since the chip area required for the conventional heavily doped portions of the source/drain regions is eliminated. Thus, the present SRAM cell occupies less chip area than a prior art SRAM cell.

Forming the MOS transistor without heavily doped portions also inhibits forward biasing of parasitic transistors in the SRAM cell thus improving latch-up immunity compared to a prior art SRAM cell.

Further, forming the MOS transistor without heavily doped portions inhibits current flow through the MOS transistor when it is on. This allows, in the case where the MOS transistor is a pullup PMOS transistor, a node connected to the MOS transistor to be pulled down faster during a write cycle thus decreasing the write cycle time of the SRAM cell compared to a prior art SRAM cell.

In accordance with another embodiment of the present invention, a method of fabricating a 6-T SRAM cell includes providing a semiconductor substrate having a first semiconductor region with a first conductivity type. The method further includes forming a first gate over a portion of the first semiconductor region and implanting a second conductivity type impurity into portions of the first semiconductor region to form a source region and a drain region of a first MOS transistor in the first semiconductor region. The first semiconductor region has a first dopant concentration and the source region and the drain region have a second dopant concentration wherein the second dopant concentration is in the range of the first dopant concentration to 2.5 times the first dopant concentration.

These and other objects, features and advantages of the present invention will be more readily apparent from the detailed description of the preferred embodiments set forth below taken in conjunction with the accompanying drawings.

DESCRIPTION OF THE PREFERRED EMBODIMENTS

In accordance with the present invention, a 6-T SRAM cell which occupies less chip area, has improved write speed and improved latch-up immunity compared to the prior art is fabricated. Several elements shown in the following figures are substantially similar. Therefore, similar reference numbers are used to represent similar elements.

Figure 3:
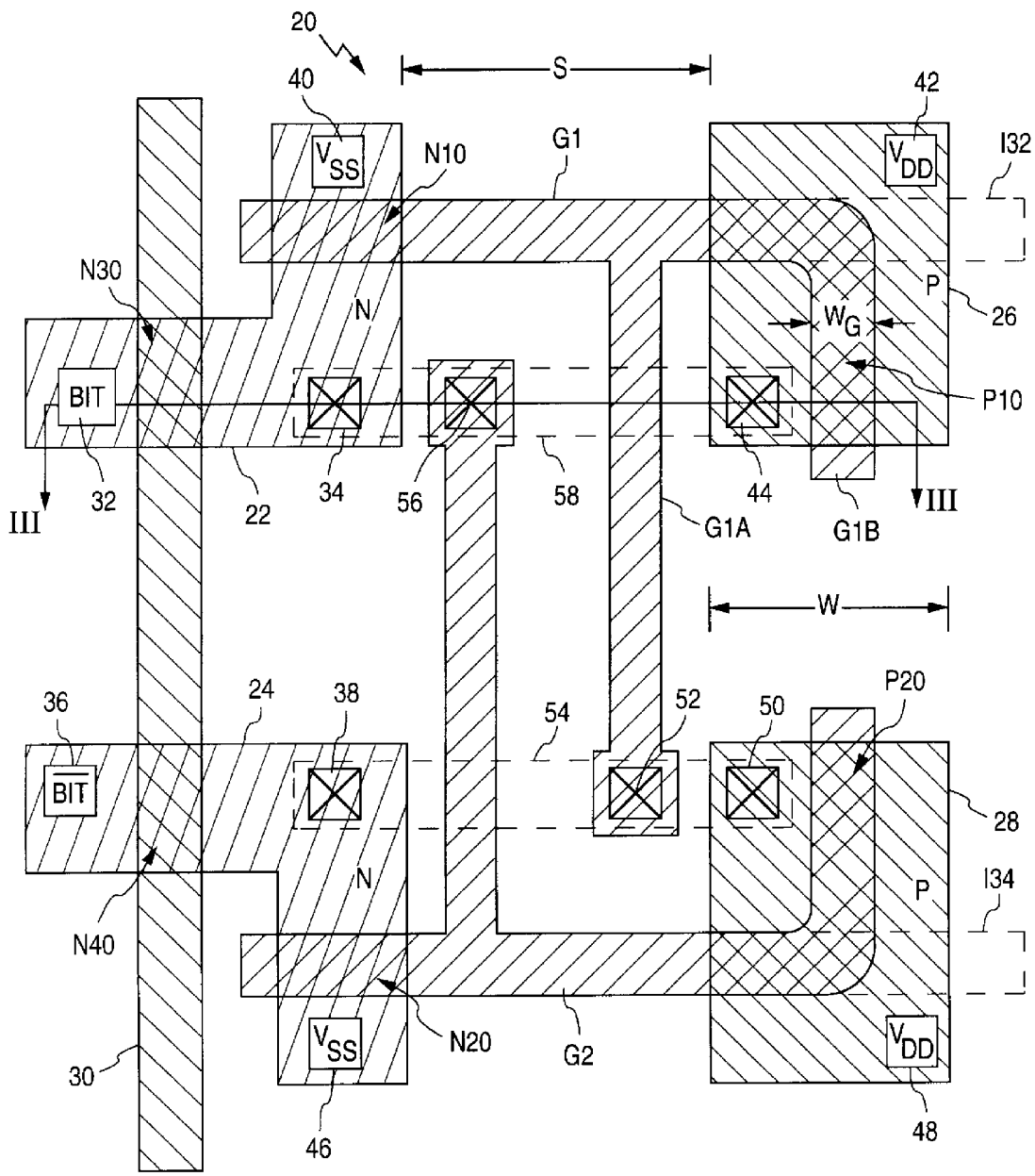
FIG. 3 is a plan view of an SRAM cell in accordance with one embodiment of the present invention.

FIG. 3 is a plan view of a 6-T SRAM cell 20 in accordance with one embodiment of the present invention. SRAM cell 20 is formed in a semiconductor substrate and includes N type active regions 22, 24 and P type active regions 26, 28. (As described in more detail below, active regions 22, 24, 26, 28 are defined by field oxide regions.)

Formed in N type active region 22 are an NMOS transistor N10 and a select NMOS transistor N30. Formed in N type active region 24 are an NMOS transistor N20 and a select NMOS transistor N40. Formed in P type active region 26 is a pullup PMOS transistor P10 and formed in P type active region 28 is a pullup PMOS transistor P20.

As shown in FIG. 3, electrically conductive contacts are formed to allow electrical interconnections with source/drain regions of the NMOS and PMOS transistors of SRAM cell 20. In particular, source/drain (S/D) contacts 32, 34 of transistor N30, S/D contacts 34, 40 of transistor N10, S/D contacts 42, 44 of transistor P10, S/D contacts 36, 38 of transistor N40, S/D contacts 38, 46 of transistor N20 and S/D contacts 48, 50 of transistor P20 are formed to allow electrical interconnections with source/drain regions of the respective transistors. S/D contacts 40, 46 are provided with a voltage $V_{SS}$ (typically ground) and S/D contacts 42, 48 are provided with a voltage $V_{DD}$ (typically 5.0 V, 3.3 V, or 2.5 V although other voltages can be used).

The conductive gates of transistors N30, N40 are formed by parts of a conductive word line 30 which extends over a portion of N type active region 22 between S/D contacts 32, 34 and over a portion of N type active region 24 between S/D contacts 36, 38. S/D contacts 32, 36 couple transistors N30 and N40 to a Bit line (not shown) and to a $\overline{\text{Bit}}$ line (not shown), respectively.

The conductive gates of transistors N10, P10 are formed by parts of a conductive gate G1 which extends over a portion of N type active region 22 between S/D contacts 34, 40 and over a portion of P type active region 26 between S/D contacts 42, 44. Similarly, the conductive gates of transistors N20, P20 are formed by parts of a conductive gate G2 which extends over a portion of N type active region 24 between S/D contacts 38, 46 and over a portion of P type active region 28 between S/D contacts 48, 50.

Gate G1 is electrically coupled at a gate contact 52 to S/D contacts 38 and 50 by a conductive interconnect layer 54. Similarly, gate G2 is electrically coupled at a gate contact 56 to S/D contacts 34, 44 by a conductive interconnect layer 58. As those skilled in the art will understand, the circuit of SRAM cell 20 is the same as that of SRAM cell 1 in FIG. 1. In particular, transistors N10, N20, N30, N40, P10, P20 of SRAM cell 20 are the same circuit elements as transistors N1, N2, N3, N4, P1, P2 of SRAM cell 1, respectively. Further, conductive interconnect layers 58, 54 of SRAM cell 20 are the same circuit elements as nodes A, B of SRAM cell 1, respectively.

Figure 4:
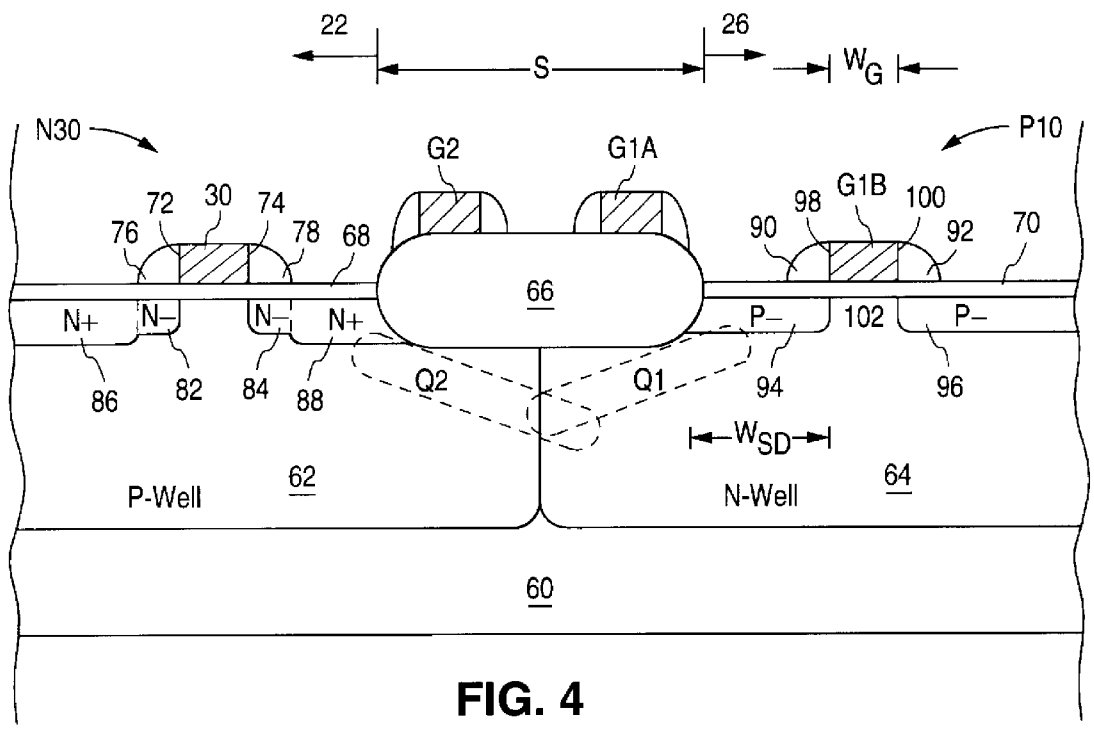
FIG. 4 is a cross-sectional view taken on the line III—III of the SRAM cell of FIG. 3.

FIG. 4 is a cross-sectional view of SRAM cell 20 taken on the line III—III of FIG. 3. For simplicity, S/D contacts 32, 34, 44, gate contact 56, interconnect layer 58, and the associated insulating layers are not illustrated in FIG. 4.

As shown in FIG. 4, a P-well 62 and an N-well 64 are formed in a semiconductor substrate 60 typically formed of silicon or doped silicon such as P type or N type silicon. Formed at the surface of substrate 60 is a field oxide region 66. As shown in FIG. 4, field oxide region 66 defines active regions 22, 26. Formed above P-well 62 and N-well 64 are gate oxide layers 68 and 70, respectively.

Formed over a channel portion of P-well 62 and over a portion of gate oxide layer 68 is conductive word line 30. Formed over a channel portion of N-well 64 and over a portion of gate oxide layer 70 is a section G1B of conductive gate G1. Formed over portions of field oxide region 66 is a section G1A of conductive gate G1 and a section of conductive gate G2.

Formed within P-well 62 are lightly doped N− source/drain regions 82, 84 laterally aligned (self-aligned) with edges 72, 74, respectively, of word line 30. Formed within N-well 64 are lightly doped P− source/drain regions 94, 96 laterally aligned (self-aligned) with edges 98, 100 of section G1B. Formed adjacent edges 72, 74 and 98, 100 of word line 30 and section G1B are sidewall spacers 76, 78 and 90, 92, respectively. Also formed within P-well 62 are heavily doped N+ source/drain regions 86, 88 laterally aligned (self-aligned) with sidewall spacers 76, 78.

Illustratively, P− source/drain regions 94, 96 have a dopant concentration which ranges from the dopant concentration of N-well 64 to 2.5 times the dopant concentration of N-well 64. N-well 64 typically has a dopant concentration of $1\times10^{15}$ atoms/cm$^3$ to $1\times10^{17}$ atoms/cm$^3$ but can have other dopant concentrations. To illustrate, if N-well 64 has a dopant concentration of $1\times10^{16}$ atoms/cm$^3$ then P− source/drain regions 94, 96 have a dopant concentration in the range of $1\times10^{16}$ atoms/cm$^3$ to $2.5\times10^{16}$ atoms/cm$^3$. P-well 62 typically has a dopant concentration of $1\times10^{15}$ atoms/cm$^3$ to $1\times10^{17}$ atoms/cm$^3$. N+ source/drain regions 86, 88 typically have a dopant concentration of $1\times10^{20}$ atoms/cm$^3$ or greater and N− source/drain regions 82, 84 typically have a dopant concentration greater than the dopant concentration of P-well 62 and less than $1\times10^{20}$ atoms/cm$^3$.

As used herein, dopant concentration refers to N type dopant concentration for N type regions and P type dopant concentration for P type regions. N type regions include N-wells, lightly doped N− source/drain regions and heavily doped N+ source/drain regions. P type regions include P-wells, lightly doped P− source/drain regions and heavily doped P+ source drain regions.

Of importance, PMOS transistor P10 is formed without the heavily doped P+ portions of source/drain regions (see P+ heavily doped source/drain regions 19 of FIG. 2 which typically have a dopant concentration of $1\times10^{18}$ atoms/cm$^3$ or greater) characteristic of prior art lightly doped drain (LDD) PMOS devices. Thus, lightly doped P− source/drain region 94 is a single continuous dopant region (has no distinct heavily doped P+ portion with dopant concentrations greater than 2.5 times the dopant concentration of N-well 64) as is P− source/drain region 96.

Forming PMOS transistor P10 with continuous lightly doped P− source/drain regions 94, 96 (without heavily doped P+ portions of source/drain regions) provides several advantages. One advantage is that the width $W_G$, i.e. the distance between edges 98 and 100, of section G1B, can be reduced as compared to the prior art.

To prevent punchthrough (conduction between P− source/drain regions 94, 96 when gate G1 is biased above the threshold voltage of transistor P10), width $W_G$ must be sufficient to prevent the drain depletion layer from extending across the N type channel region 102 of transistor P10. By forming transistor P10 with continuous lightly doped P− source/drain regions 94, 96, the width of the drain depletion layer is reduced. This allows width $W_G$ to be reduced while maintaining sufficient punchthrough protection. In this embodiment, for 0.5 micron ($\mu$m) technology, the width $W_G$ can be reduced to 0.7 $\mu$m, 0.4 $\mu$m when $V_{DD}$ is 5.0 V, 3.3 V, respectively. (In 0.5 $\mu$m technology, the width of a feature (such as a gate) plus the spacing between features is greater than or equal to 0.5 $\mu$m.)

Referring back to FIG. 3, another advantage of forming PMOS transistor P10 with continuous lightly doped source/drain regions 94, 96 (not shown) is that the distance S between active regions 22 and 26 can be reduced as compared to the prior art. Referring once again to FIG. 4, distance S is the width of field oxide region 66.

To provide adequate electrical isolation between P− source/drain region 94 and P-well 62, field oxide region 66 must have a sufficient width, i.e. the distance S must be sufficient. By forming a continuous lightly doped P− source/drain region 94, the width of the drain depletion layer between P− source/drain region 94 and P-well 62 is reduced. Accordingly, the distance S can be reduced while maintaining sufficient punchthrough protection between P− source/drain region 94 and P-well 62. In this embodiment, for 0.5 $\mu$m technology, the distance S is reduced by approximately 0.2 $\mu$m to 0.5 $\mu$m compared to the prior art and in one embodiment, for 0.5 $\mu$m technology, the distance S is 2.5 $\mu$m.

Referring back to FIG. 3, another advantage of forming PMOS transistor P10 with continuous lightly doped P− source/drain regions 94, 96 (not shown) is that the width W of transistor P10 is reduced as compared to the prior art. Referring to FIG. 4, width W (not shown) is determined in part by the width $W_{SD}$ of each of the P− source/drain regions 94, 96. By eliminating the conventional heavily doped P+ portions of source/drain regions (see P+ heavily doped source/drain regions 19 of FIG. 2) characteristics of prior art PMOS LDD devices which require a certain additional amount of chip area, the width $W_{SD}$ can be reduced. This reduces the width W of transistor P10 and the chip area occupied by SRAM cell 20. In this embodiment, for 0.5 $\mu$m technology, the width $W_{SD}$ can be reduced by 0.2 $\mu$m as compared to the prior art and in one embodiment, for 0.5 $\mu$m technology, the width $W_{SD}$ is 1.0 $\mu$m.

Thus, a SRAM cell in accordance with the present invention occupies less chip area, and in this embodiment occupies 15% less chip area, than a prior art SRAM cell.

Another advantage of forming PMOS transistor P10 with continuous lightly doped P− source/drain regions 94, 96 is that latch-up immunity is improved compared to the prior art. Latch-up occurs when parasitic bipolar transistors located within SRAM cell 20 are connected in a positive feedback loop. Referring to FIG. 4, a parasitic PNP transistor Q1 is formed by P− source/drain region 94, N-well 64 and P-well 62. A parasitic NPN transistor Q2 is formed by N+ source/drain region 88, P-well 62 and N-well 64.

Figure 5:
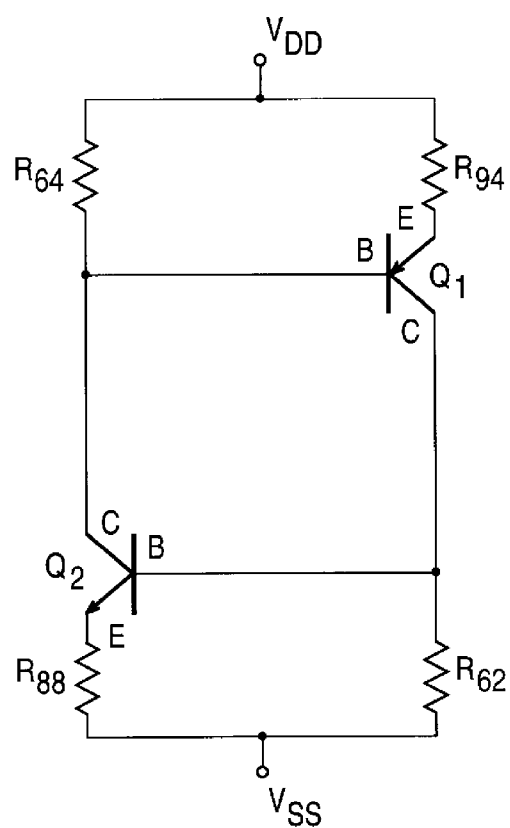
FIG. 5 is a schematic circuit diagram of a latchup circuit of the SRAM cell of FIG. 3.

FIG. 5 is a schematic circuit diagram of a latchup circuit of SRAM cell 20. As shown in FIG. 5, the emitter of parasitic transistor Q1 is coupled through resistors $R_{94}$ and $R_{64}$ to the base of transistor Q1, where resistor $R_{94}$ is the resistance of lightly doped P− source/drain region 94 and resistor $R_{64}$ is the resistance of N-well 64. Similarly, the emitter of parasitic transistor Q2 is coupled through resistors $R_{88}$ and $R_{62}$ to the base of transistor Q2, where resistor $R_{88}$ is the resistance of N+ heavily doped source/drain region 88 and resistor $R_{62}$ is the resistance of P-well 62. The collector of transistor Q1 is coupled to the base of transistor Q2 and the collector of transistor Q2 is coupled to the base of transistor Q1.

Latch-up occurs when the voltage drop between the emitter and base of transistor Q1 is sufficient to turn transistor Q1 on. This causes a current to flow between the emitter and collector of transistor Q1. This in turn produces a voltage drop across resistor $R_{62}$, hence a voltage drop between the emitter and base of transistor Q2. If the voltage drop between the emitter and base of transistor Q2 is sufficient, then transistor Q2 turns on. This causes current flow between the emitter and collector of transistor Q2 which increases the current flow through resistor $R_{64}$. This increases the voltage drop between the emitter and base of transistor Q1. The positive feedback loop continues resulting in undesirable latch-up which generates heat and ultimately failure of the semiconductor device.

By forming PMOS transistor P10 (FIG. 4) with continuous lightly doped P− source/drain regions 94, 96 the resistance of resistor $R_{94}$ (FIG. 5) is increased. This increases the voltage drop across resistor $R_{94}$ which inhibits forward biasing (inhibits the emitter voltage from being greater than the base voltage) of transistor Q1 which, in turn, inhibiting transistor Q1 from turning on and improves latch-up immunity. Thus, a SRAM cell in accordance with the present invention has improved latch-up immunity compared to the prior art.

Figure 1:
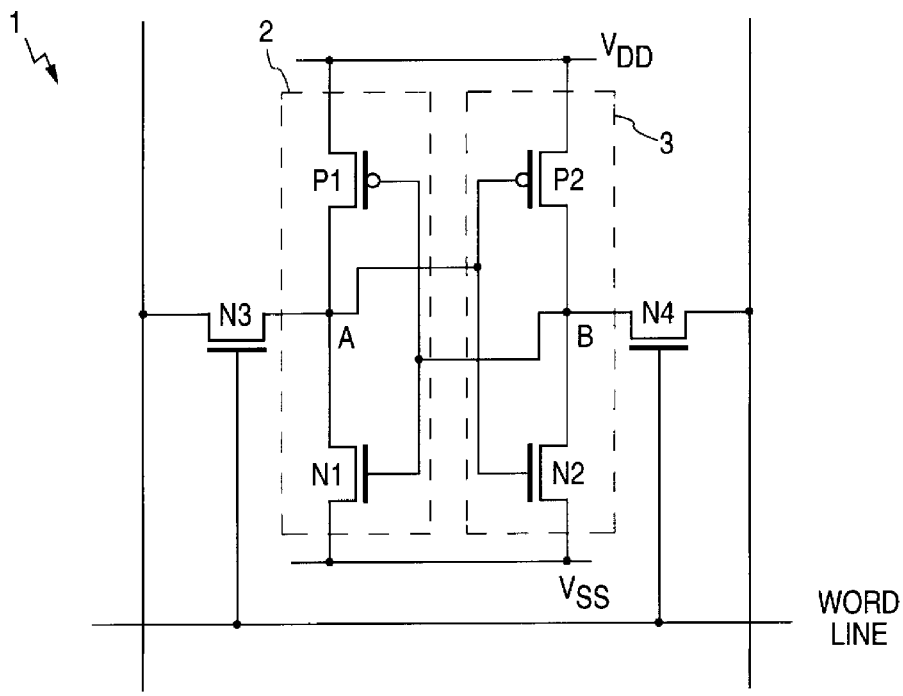
FIG. 1 is a schematic circuit diagram of a conventional six transistor SRAM cell and also of an SRAM cell in accordance with the present invention.

Another advantage of forming PMOS transistor P10 with continuous lightly doped P− source/drain regions 94, 96 (FIG. 4) is that write cycle time is decreased (write speed increased) compared to the prior art, where write cycle time is the amount of time required to complete a write cycle and write speed is the inverse of write cycle time. Referring to FIG. 1, during a write cycle, transistors N3 and N4 are turned on to write data and $\overline{\text{data}}$ placed on the Bit line and $\overline{\text{Bit}}$ line, respectively, to SRAM cell 1.

To illustrate, assuming that SRAM cell 1 is in a latched state before the write cycle with node A at a logic high state and node B at a logic low state, transistors N3, N4 being off. Accordingly, transistors P1, N2 are on and transistors P2, N1 are off. During a write cycle, data and $\overline{\text{data}}$ are placed on the Bit line and $\overline{\text{Bit}}$ line, respectively, and for this illustration, data being a logic low state and $\overline{\text{data}}$ being a logic high state. The word line is then activated turning transistors N3, N4 on. Data and $\overline{\text{data}}$ on the Bit line and $\overline{\text{Bit}}$ line pull down node A and pullup node B, respectively, causing SRAM cell 1 to flip-flop thus completing a write cycle.

The time required to pull down node A by the data on the bit line, hence the write cycle time of SRAM cell 1, is determined in part by the conductivity of transistor P1. Generally, it is desirable to fabricate a highly resistive transistor P1, i.e. a transistor P1 which has a high resistance when it is on (a high on-resistance), to inhibit current flow through transistor P1 during a write cycle. This decreases the time required to pull node A down and hence decreases the write cycle time (increases the write speed) of SRAM cell 1. In the above illustration, a write cycle is described in which the on-resistance of transistor P1 determines the time required to pull down node A. It is understood that in other write cycles (write cycles in which SRAM cell 1 flip-flops and node A goes from a logic low state to a logic high state and node B goes from a logic high state to a logic low state), the on-resistance of transistor P2 determines the time required to pull node B down and hence determines the write cycle time of SRAM cell 1. Thus it is desirable to fabricate a 6-T SRAM cell in which both PMOS pullup transistors have a high on-resistance.

Referring again to FIG. 4, SRAM cell 20 in accordance with the invention has improved write speed (decreased write cycle time) as compared to the prior art. Generally, the resistivity of a semiconductor region is a function of the dopant concentration of the semiconductor region, with heavily doped semiconductor regions having lower resistivity than lightly doped semiconductor regions. Thus, by forming continuous lightly doped P− source/drain regions 94, 96, PMOS transistor P10 has a high on-resistance compared to a prior art PMOS transistor having heavily doped P+ portions of source/drain regions (see P+ heavily doped source/drain regions 19 of FIG. 2.) By forming transistor P10 with a high on-resistance, the time required to pull down conductive interconnect layer 58 (FIG. 3) by data placed on the Bit line electrically connected to S/D contact 32 is decreased. This improves the write speed (decreases write cycle time) of SRAM cell 20 as compared to the prior art. In one embodiment, the write cycle time of SRAM cell 20 is decreased by 15%.

Thus, SRAM cell 20 in accordance with the present invention occupies less chip area, has improved latch-up immunity and faster write speed compared to a prior art SRAM cell.

FIGS. 6, 7, 8, 9, 10, 11 and 12 are cross-sectional views of SRAM cell 20 taken along the line III—III of FIG. 3 at various stages during its fabrication in accordance with one embodiment of the present invention.

Figure 6:
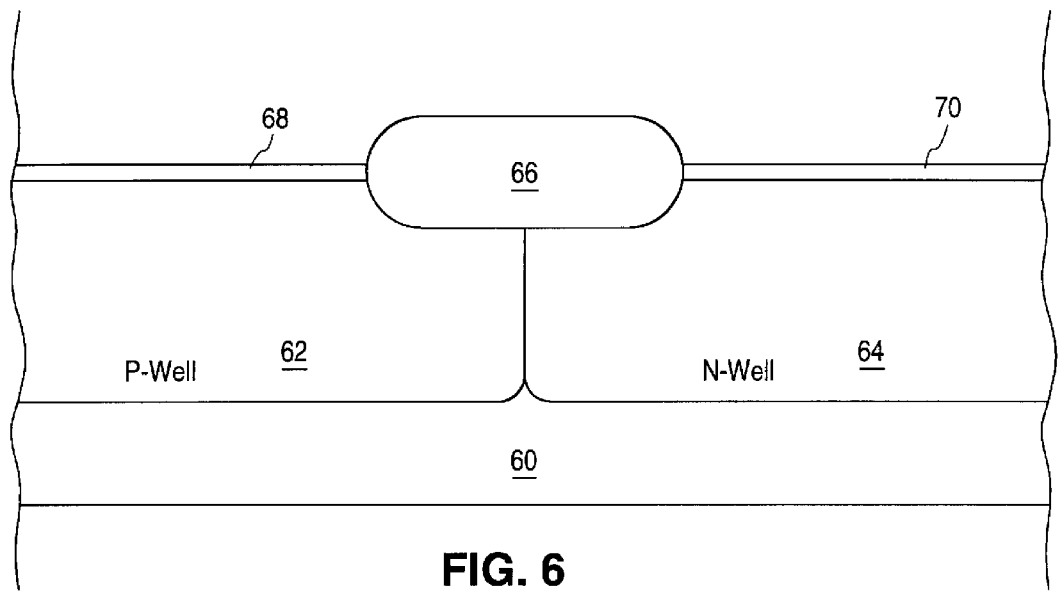
FIGS. 6, 7, 8, 9, 10, 11 and 12 are cross-sectional views of an SRAM cell at various stages during its fabrication in accordance with one embodiment of the present invention.

Referring to FIG. 6, a P-well 62 and N-well 64 are formed in a semiconductor substrate 60, typically a doped silicon substrate such as a N type or P type silicon substrate, using conventional techniques well known to those skilled in the art. A field oxide (typically silicon dioxide) region 66 is then formed at the top surface of substrate 60 using a well known LOCOS process or other suitable technique. Illustratively, field oxide region 66 has a thickness in the range of 3500 Å to 7000 Å, and in one embodiment has a thickness of 4000 Å, but can have other thicknesses. Note that in an alternative embodiment, field oxide region 66 is formed before P-well 62 and N-well 64 are formed. In another alternative embodiment, substrate 60 is a P type or N type substrate which forms one of the well regions and a separately doped P-well 62 or N-well 64, respectively, is not formed.

Gate oxide layers 68, 70 are then formed above P-well 62, N-well 64, respectively, and above the surface of substrate 60. Illustratively, oxide layers 68, 70 are thermally grown or chemical vapor deposition (CVD) deposited oxide layers, preferably thermally grown oxide layers. As a further illustration, oxide layers 68, 70 are approximately 80 angstroms (Å) or 150 Å thick for a 3.0 V or 5.0 V device, respectively although oxide layers 68, 70 can have other thicknesses.

Figure 7:
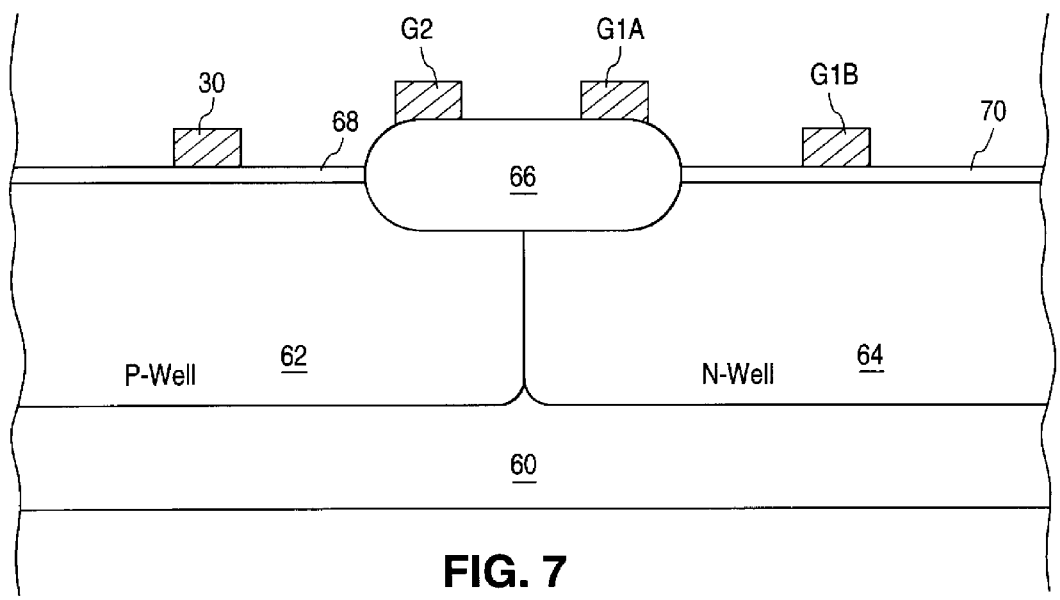

As shown in FIG. 7, a conductive layer is deposited and patterned to form conductive word line 30, conductive gate G1 (comprising sections G1A and G1B) and conductive gate G2. For example, the deposited conductive layer is a single layer of doped polysilicon such as N type polysilicon or P type polysilicon. However, the conductive layer can be a multilayered conductive layer. For example, the conductive layer can be a bilayered conductive layer including a doped polysilicon layer with overlying metal silicide layer such as tungsten silicide, molybdenum silicide or titanium silicide.

As shown in FIG. 7, a section of word line 30 overlies a portion of P-well 62, section G1B of gate G1 overlies a portion of N-well 64 and section G1A of gate G1 and a section of gate G2 overlie field oxide region 66.

Figure 8:
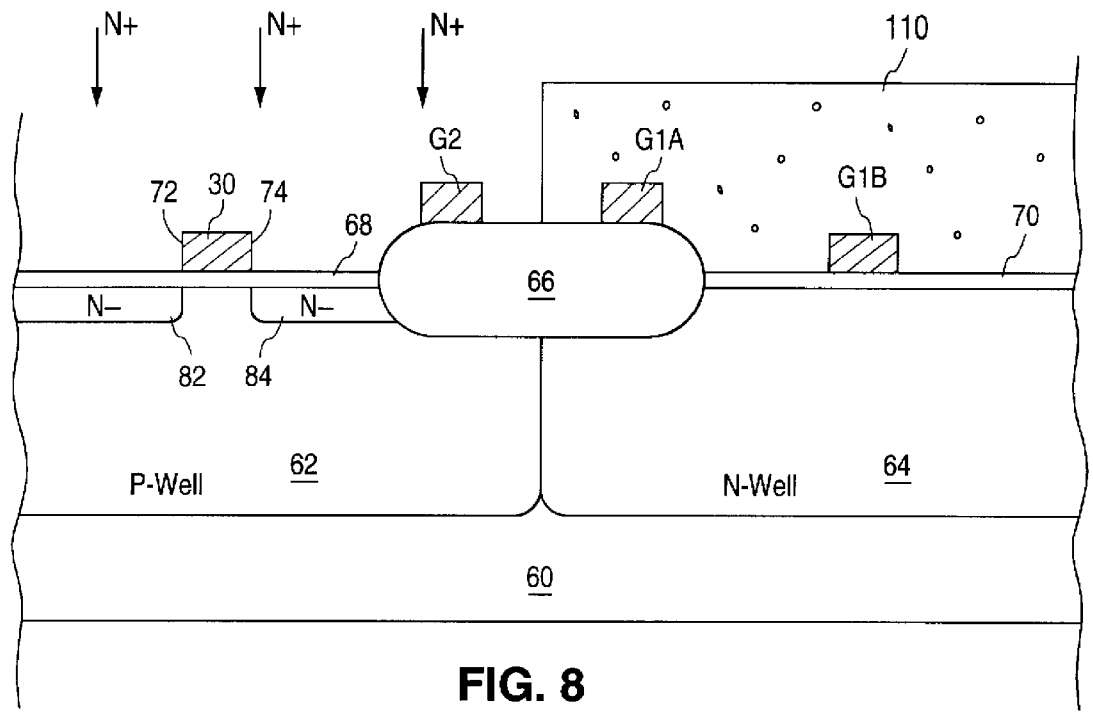

Referring to FIG. 8, a layer of a suitable material, typically photoresist, is formed and patterned to form a masking layer 110. As shown in FIG. 8, masking layer 110 is formed over section G1B and over a portion of substrate 60 including N-well 64. Although masking layer 110 is illustrated as covering section G1A and leaving exposed the section of gate G2, masking layer 110 can cover, or alternatively, leave exposed, both section G1A and the section of gate G2 or portions thereof.

After masking layer 110 is formed, an N type impurity (illustrated as N+) such as phosphorus or arsenic is implanted into portions of P-well 62 to form lightly doped N− source/drain regions 82, 84 in P-well 62. For example, phosphorus is implanted at an energy of 30 keV and a dosage of $1 \times 10^{13}$ ions/cm$^2$ to $5 \times 10^{13}$ ions/cm$^2$. The N type impurity does not pass through word line 30 and into the underlying channel portion of P-well 62, thus N− source/drain regions 82, 84 are laterally aligned (self-aligned) with edges 72, 74 of word line 30, respectively. After N− source/drain regions 82, 84 are formed, masking layer 110 is removed.

Figure 9:
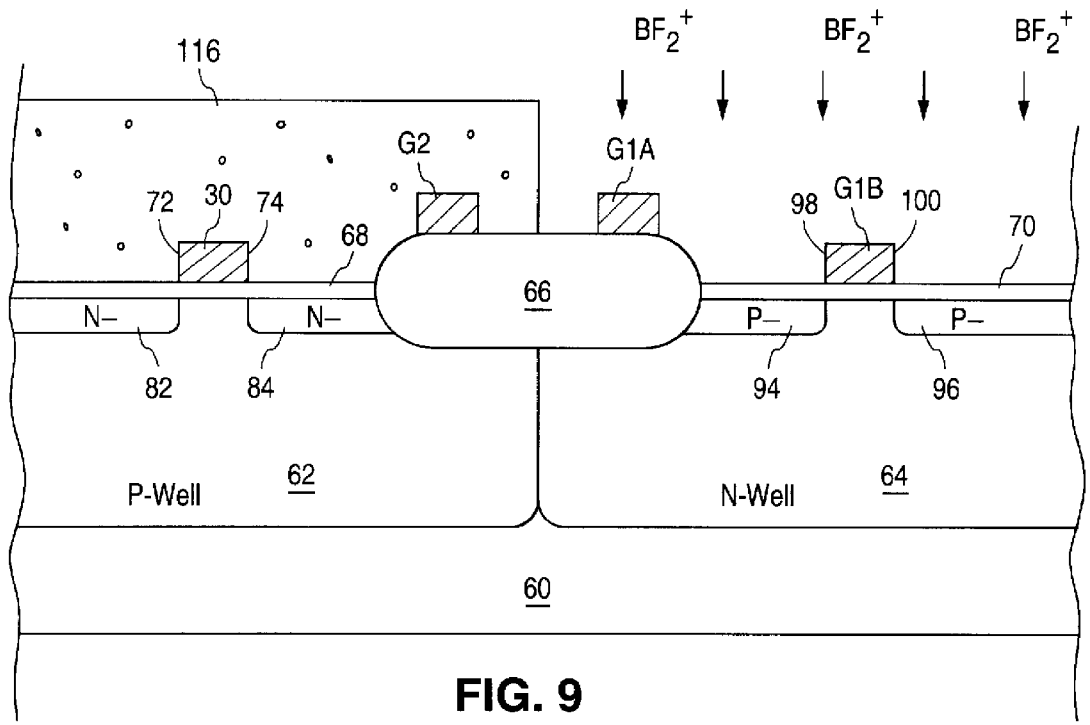

Referring to FIG. 9, a layer of a suitable material, typically photoresist, is formed and patterned to form a masking layer 116. As shown in FIG. 9, masking layer 116 is formed over word line 30 and over a portion of substrate 60 including P-well 62. Although masking layer 116 is illustrated as covering the section of conductive gate G2 and leaving exposed section G1A, masking layer 116 can cover, or alternatively, leave exposed, both section G1A and the section of conductive gate G2 or portions thereof.

After masking layer 116 is formed, a P type impurity such as boron or boron diflouride ions (BF$_2^+$) is implanted into portions of N-well 64 to form continuous lightly doped P− source/drain regions 94, 96 in N-well 64. For example, BF$_2^+$ is implanted at an energy of 70 keV and a dosage of $1 \times 10^{12}$ ions/cm$^2$ to $1 \times 10^{13}$ ions/cm$^2$. The P type impurity does not pass through section G1B and into the underlying channel portion of N-well 64, thus P− source/drain regions 94, 96 are laterally aligned (self-aligned) with edges 98, 100 of section G1B, respectively. After P− source/drain regions 94, 96 are formed, masking layer 116 is removed.

In an alternative embodiment (not shown), after N− source/drain regions 82, 84 are formed and masking layer 110 (FIG. 8) is removed, instead of forming masking layer 116 and then performing a P type impurity implantation as shown in FIG. 9, a blanket P type impurity implantation is performed to form P− source/drain regions 94, 96. More particularly, referring to FIG. 8, in this alternative embodiment, after masking layer 110 is removed, the entire structure is subjected to a P type impurity implantation (a blanket P type impurity implantation). The P type impurity is implanted into portions of N-well 64 to form P− source/drain regions 94, 96 in the same manner as that described in reference to FIG. 9.

The P type impurity is also implanted into N− source/drain regions 82, 84. However, N− source/drain regions have a sufficient N type dopant concentration to prevent significant counter-doping of N− source/drain regions 82, 84 by the implanted P type impurity.

In another embodiment (not shown), the FIG. 7 structure is subjected to a blanket N type impurity implantation to form N− source/drain regions 82, 84 (see FIG. 9). Referring to FIG. 9, during this blanket N type impurity implantation, the N type impurity also enters and dopes the portions of N-well 64 where P− source/drain regions 94, 96 are to be subsequently formed. A patterned masking layer 116 is then formed and a P type impurity implantation is performed as illustrated in FIG. 9. The P type impurity implantation is performed with a dosage sufficient to counter-dope (compensate) the N type doping to form P− source/drain regions 94, 96.

In alternative embodiments (not shown), P− source/drain regions 94, 96 are formed before N− source/drain regions 82, 84 are formed by reversing the conductivity type of the impurity used in the implantations and reversing the corresponding masking steps described above. In one of these embodiments, a P type impurity implantation similar to that illustrated in FIG. 9 using masking layer 116 is performed. Masking layer 116 is then removed and an N type impurity implantation similar to that illustrated in FIG. 8 using masking layer 110 is performed.

In another of these embodiments, masking layer 116 is formed and a P type impurity implantation is performed as illustrated in FIG. 9. Masking layer 116 is then stripped an a blanket N type impurity implantation is performed.

In yet another of these embodiments, the FIG. 7 structure is subjected to a blanket P type impurity implantation, followed by the formation of masking layer 110 and the implantation of N type impurities as illustrated in FIG. 8.

Figure 10:
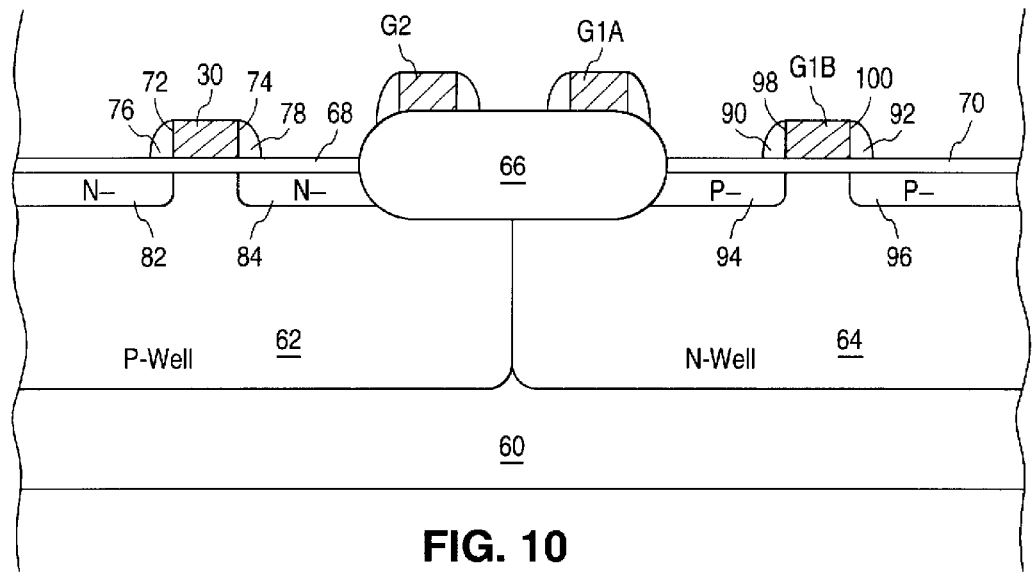

Referring to FIG. 10, after the formation of N− source/drain regions 82, 84 and P− source/drain regions 94, 96, any masking layer remaining is removed. Sidewall spacer 76, 78 and 90, 92 are formed adjacent edges 72, 74 and 98, 100 of word line 30 and section G1B, respectively. (Sidewall spacers are also simultaneously formed adjacent edges of gate G2 and section G1A.) Illustratively, to form sidewall spacers 76, 78 and 90, 92, a 2000 Å to 5000 Å thick layer of an insulating material (not shown) such as silicon dioxide (SiO$_2$) or silicon nitride (Si$_3$N$_4$) is deposited using chemical vapor deposition (CVD) techniques. The insulating layer is then anisotropically etched to form sidewall spacers 76, 78, and 90, 92. Although in FIG. 10, oxide layers 68, 70 are intact, the exposed portions of oxide layers 68, 70 (portions not covered by word line 30, section G1B, or sidewall spacers 76, 78, 90, 92) may be removed during the anisotropical spacer etch.

After the formation of sidewall spacers 76, 78, and 90, 92, a thermal cycle is performed to anneal and drive in N− source/drain regions 82, 84 and P− source/drain regions 94, 96. Illustratively, the thermal cycle involves heating the semiconductor structure to 850° C. for 30 minutes although thermal cycles using other temperatures and durations can be performed. During the thermal cycle, N− source/drain regions 82, 84 are laterally driven to extend slightly under word line 30 and P− source/drain regions 94, 96 are laterally driven to extend slightly under section G1B. However, in alternative embodiments, this thermal cycle is not performed, for example when the semiconductor substrate is subjected to a thermal cycle in subsequent processing step used to fabricate other semiconductor devices from the same semiconductor substrate.

In another embodiment, N− source/drain regions 82, 84 and P− source/drain regions 94, 96 are formed using angled implantations in contrast to the zero degree implantations described above (unless otherwise indicated all implantations are zero degree implantations). Since the impurities are implanted at an angle (in contrast to being implanted perpendicular to a plane generally parallel to the top surface of substrate 60 which is a zero degree implantation), the N type and P type impurities travel slightly under word line 30 and section G1B, respectively. Thus, in this embodiment, N− source/drain regions 82, 84 and P− source/drain regions 94, 96 extend slightly underneath word line 30 and section G1B, respectively, making the thermal cycle described above unnecessary.

Figure 11:
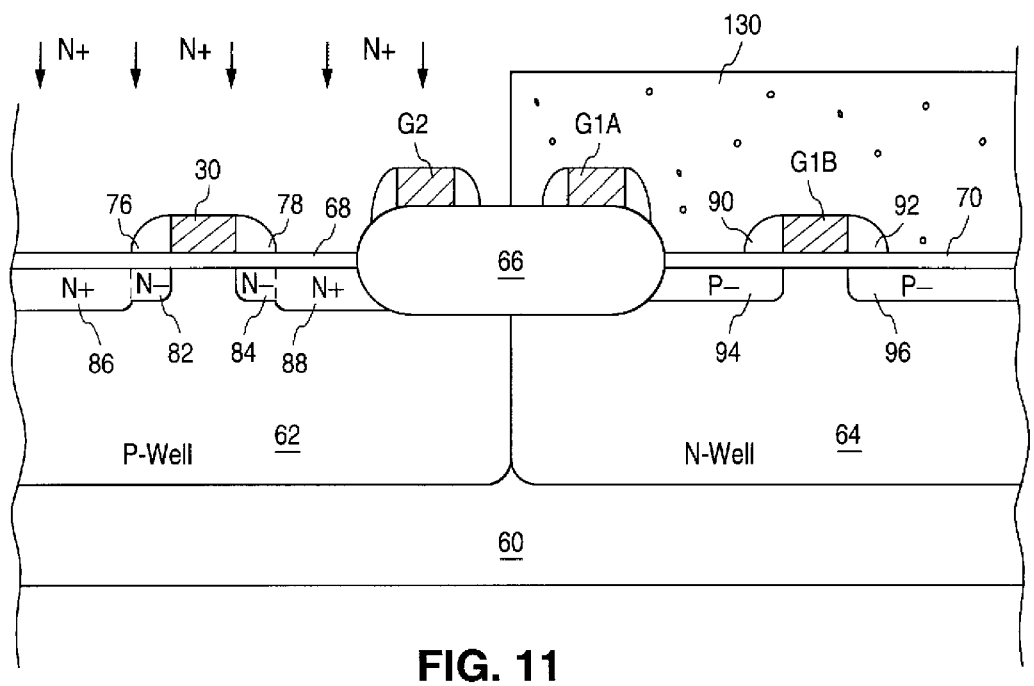

Referring to FIG. 11, a masking layer of suitable material, typically photoresist, is deposited and patterned to form a masking layer 130. Masking layer 130 is formed over a portion of substrate 60 and in particular over N-well 64, over section G1B and over sidewall spacers 90, 92. Although masking layer 130 is illustrated as covering section G1A and leaving exposed the section of conductive gate G2, masking layer 130 can cover, or alternatively, leave exposed, both section G1A and the section of conductive gate G2 or portions thereof.

After masking layer 130 is formed, N type impurities are implanted into portions of P-well 62 to form heavily doped N+ source/drain regions 86, 88 in P-well 62. For example, phosphorus is implanted into portions of P-well 62 using an energy of 80 keV and a dosage of $5\times10^{15}$ ions/cm$^2$ to form N+ source/drain regions 86, 88 in P-well 62.

The N type impurities are implanted with an energy insufficient to pass the N type impurities through word line 30 or the thicker portions of sidewall spacers 76, 78 and into the underlying portions of P-well 62. (Depending upon the energy used, the N type impurities may not pass through any portions of sidewall spacers 76, 78.) Thus, N+ source/drain regions 86, 88 are laterally aligned (self-aligned) with sidewall spacers 76, 78, respectively. Masking layer 130 is then removed resulting in the structure illustrated in FIG. 4.

Figure 2:
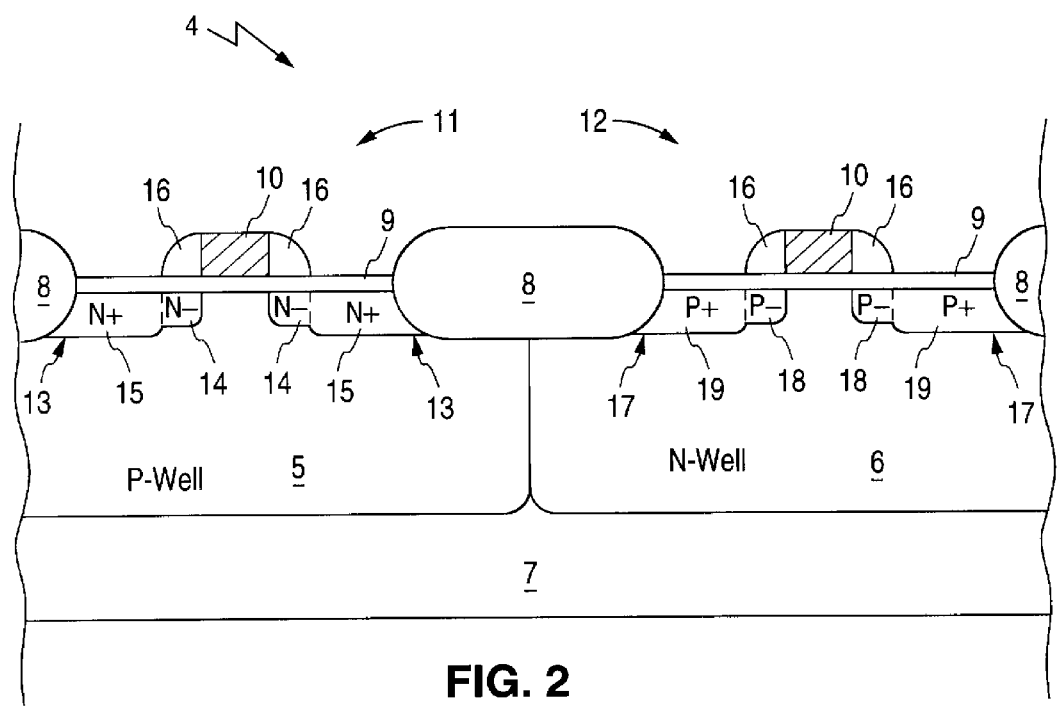
FIG. 2 is a cross-sectional view of a conventional LDD CMOS structure used in conventional SRAM cells.

In one embodiment, a P type impurity implantation is performed to form heavily doped (typically $1\times10^{18}$ atoms/cm$^3$ or greater) P+ portions of source/drain regions of PMOS transistors formed in substrate 60 external to SRAM cell 20. To illustrate, a P type impurity implantation is performed to form P+ heavily doped source/drain regions 19 of PMOS transistor 12 of FIG. 2. (In this embodiment, substrate 7 of FIG. 2 and substrate 60 of FIG. 4 are the same semiconductor substrate. Also, N-well 6, P− source/drain regions 18, sidewall spacers 16, gate oxide layer 9, gate 10 and field oxide 8 of FIG. 2 are typically formed simultaneously with N-well 64, P− source drain regions 94, 96, sidewall spacers 90, 92, gate oxide layer 70, gate G1, and field oxide 66 of FIG. 4, respectively.)

In this embodiment, a masking layer is formed over transistors N30 and P10 (FIG. 4) to mask them during this P type impurity implantation. Thus, in this embodiment, PMOS transistor P10 of SRAM cell 20 has source/drain regions 94, 96 with a dopant concentration profile different than the dopant concentration profile of the source/drain regions 17 of PMOS transistor P12 (FIG. 2). More particularly, PMOS transistor P12 (FIG. 2) has source/drain regions 17 consisting of lightly doped P− source/drain regions 18 and heavily doped P+ source/drain regions 19, i.e. PMOS transistor P12 has source drain regions 17 with first portions (heavily doped P+ source/drain region 19) having a higher dopant concentration than second portions (lightly doped P− source/drain regions 18) and PMOS transistor P10 (FIG. 4) is formed with an absence of heavily doped P+ portions of source/drain regions. After this P type impurity implantation, the masking layer (not shown) over transistors N30 and P10 is removed resulting in the structure illustrated in FIG. 4.

Figure 12:
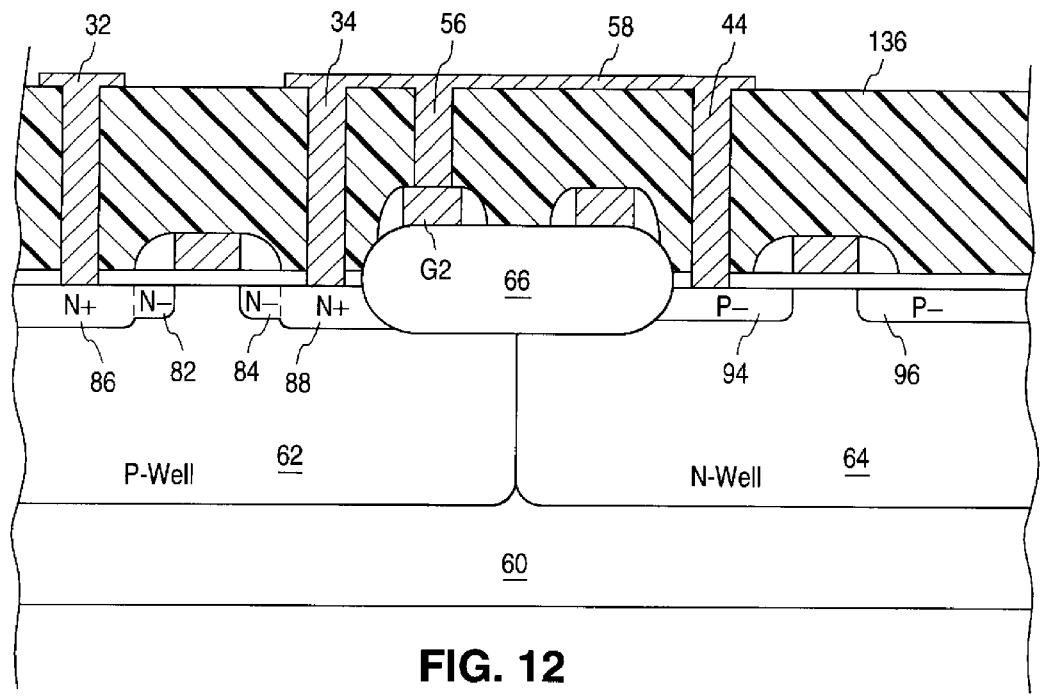

Referring to FIG. 12, the remainder, i.e. contacts, insulating layers and interconnect layers, of SRAM cell 20 is then fabricated using conventional techniques. In particular, an insulating layer 136 is deposited, a masking layer typically of photoresist (not shown) is deposited on insulating layer 136 and patterned. The exposed portions of insulating layer 136 are then etched to form cavities in insulating layer 136 in which the electrically conductive contacts will be subsequently formed. After the etch, the masking layer is removed. A conductive layer is then deposited over insulating layers 136 and into the etched cavities. Another masking layer typically of photoresist (not shown) is deposited and patterned to expose portions of the conductive layer. The exposed portions of the conductive layer are then etched and the remaining portions of the conductive layer form contacts 32, 34, 56, 44 and interconnect layer 58. As shown in FIG. 11, contacts 32, 34 are electrically connected to N+ source/drain regions 86, 88, respectively, contact 44 is electrically connected to P− source/drain region 94 and contact 56 is electrically connected to gate G2 and also to contacts 34, 44 by interconnect layer 58.

For simplicity, in the above discussion, several advantages of SRAM cell 20 and the fabrication thereof are described in reference to transistors P10, N30. It is understood that NMOS transistors N10, N20 and N40 are similar in structure and are fabricated simultaneously with transistor N30. Similarly, PMOS transistor P20 is similar in structure and is fabricated simultaneously with transistor P10.

In an alternative embodiment, referring to FIG. 4, P− source/drain region 94 is a continuous dopant region having no distinct heavily doped P+ portion with a dopant concentration greater than $1\times10^{16}$ atoms/cm$^3$ as is P− source/drain region 96. In this embodiment, N-well 64 has a dopant concentration less than the dopant concentration of P− source/drain regions 94, 96, i.e. less than $1\times10^{16}$ atoms/cm$^3$. Thus, in this embodiment, the dopant concentration of P− source/drain regions 94, 96 can exceed 2.5 times the dopant concentration of N-well 64.

In another alternative embodiment, referring to FIG. 3, in addition to forming transistors P10, P20 with source/drain regions having an absence of heavily doped P+ portions, transistors N10, N20, N30 and N40 are formed with source/drain regions having an absence of heavily doped N+ portions. In this embodiment, the N+ implantation illustrated in FIG. 11 is not performed (or alternatively, SRAM cell 20 is completely masked during the N+ implantation used to form heavily doped N+ source/drain regions of devices, not shown, formed in substrate 60 external to SRAM cell 20) and heavily doped N+ source/drain regions 86, 88 are not formed. In this embodiment, the lightly doped N− source/drain regions of transistors N10, N20, N30 and N40 (FIG. 3) typically have a dopant concentration which ranges from the dopant concentration of the respective P-well in which the source/drain regions are formed to 2.5 times the dopant concentration of the respective P-well but can have other dopant concentrations.

In another embodiment, instead of fabricating a 6-T SRAM cell with 2 PMOS transistors and 4 NMOS transistors, a 6-T SRAM cell with 2 NMOS and 4 PMOS transistors is fabricated. In this embodiment, referring to FIG. 1, PMOS select transistors (not shown) are fabricated in place of NMOS select transistors N3, N4. Referring to FIG. 3, in this embodiment, active regions 22, 24 are P type, active regions 26, 28 are N type, S/D contacts 40, 46 are provided with a voltage $V_{DD}$, S/D contacts 42, 48 are provided with a voltage $V_{SS}$, PMOS transistors P10, P20 are NMOS transistors, NMOS transistors N10, N20 are PMOS transistors and NMOS select transistors N30, N40 are PMOS select transistors.

Figure 13:
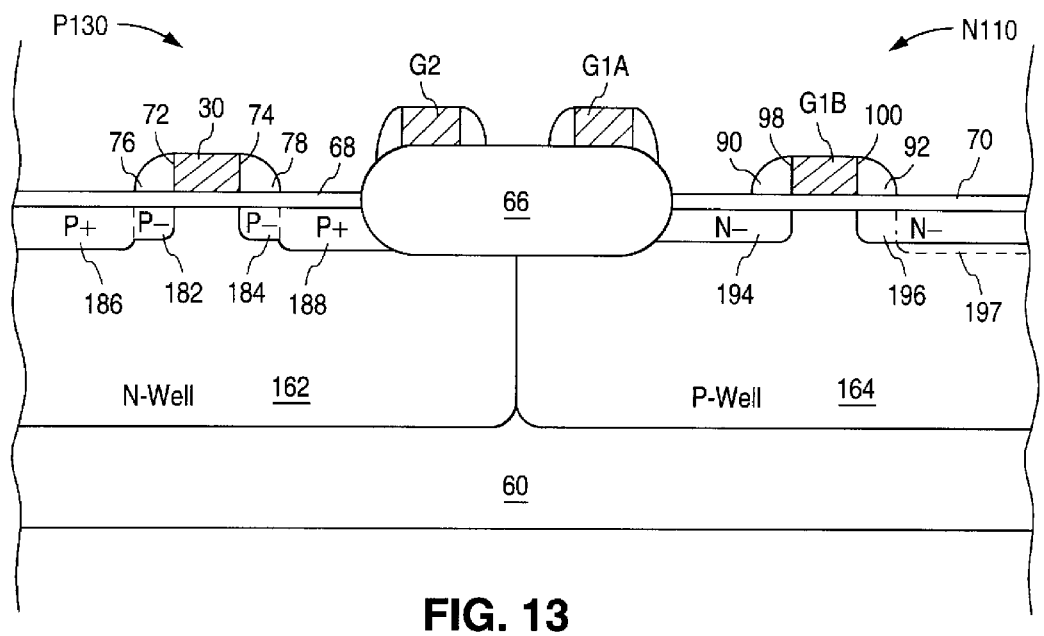
FIG. 13 is a cross-sectional view taken on the line III—III of the SRAM cell of FIG. 3 in accordance with an alternative embodiment of the present invention.

FIG. 13 is a cross-sectional view of SRAM cell 20 taken on the line III—III of FIG. 3 in accordance with this embodiment of the present invention. For simplicity, S/D contacts 32, 34, 44, gate contact 56, interconnect layer 58, and the associated insulating layers are not illustrated in FIG. 13. FIG. 13 is substantially similar to FIG. 4 except the conductivity types of the semiconductor regions have been reversed.

As shown in FIG. 13, an N-well 162 and a P-well 164 are formed in semiconductor substrate 60. Formed within N-well 162 are lightly doped P– source/drain regions 182, 184 laterally aligned (self-aligned) with edges 72, 74, respectively, of word line 30. Formed within P-well 164 are lightly doped N– source/drain regions 194, 196 laterally aligned (self-aligned) with edges 98, 100 of section G1B. Formed within N-well 162 are heavily doped P+ source/drain regions 186, 188 laterally aligned (self-aligned) with sidewall spacers 76, 78.

Illustratively, N– source/drain regions 194, 196 have a dopant concentration which ranges from the dopant concentration of P-well 164 to 2.5 times the dopant concentration of P-well 164. P-well 164 typically has a dopant concentration of $1\times10^{15}$ atoms/cm$^3$ to $1\times10^{17}$ atoms/cm$^3$. N-well 162 typically has a dopant concentration of $1\times10^{15}$ atoms/cm$^3$ to $1\times 10^{17}$ atoms/cm$^3$. P+ source/drain regions 186, 188 typically have a dopant concentration of $1\times10^{18}$ atoms/cm$^3$ or greater and P– source/drain regions 182, 184 typically have a dopant concentration greater than the dopant concentration of N-well 162 and less than $1\times10^{18}$ atoms/cm$^3$.

In one embodiment, NMOS transistor N110 has source/drain regions 194, 196 with a dopant concentration profile different than source/drain regions of NMOS transistors formed in substrate 60 external to the SRAM cell which includes transistor N110. To illustrate, NMOS transistor 11 of FIG. 2 is formed in substrate 60 external to the SRAM cell which includes transistor N110. (In this embodiment, substrate 7 of FIG. 2 and substrate 60 of FIG. 13 are the same semiconductor substrate. Also, P-well 5, N– source/drain regions 14, sidewall spacers 16, gate oxide layer 9, gate 10 and field oxide 8 of FIG. 2 are typically formed simultaneously with P-well 164, N– source/drain regions 194, 196 sidewall spacers 90, 92, gate oxide layer 70, gate G1 and field oxide region 66 of FIG. 13, respectively.) Thus, NMOS transistor 11 (FIG. 2) is formed with source/drain regions 13 with first portions (heavily doped N+ source/drain regions 15 which typically have a dopant concentration of $1\times10^{20}$ atoms/cm$^3$ or greater) having a higher dopant concentration than second portions (lightly doped N– source/drain regions 14). In contrast, NMOS transistor N110 (FIG. 13) is formed with source/drain regions 194, 196 having an absence of heavily doped N+ portions of source/drain regions.

The structure of FIG. 13 can be fabricated using the methods illustrated in FIGS. 6, 7, 8, 9, 10 and 11 except that the conductivity types of the implanted impurities and semiconductor regions are reversed.

Figure 14:
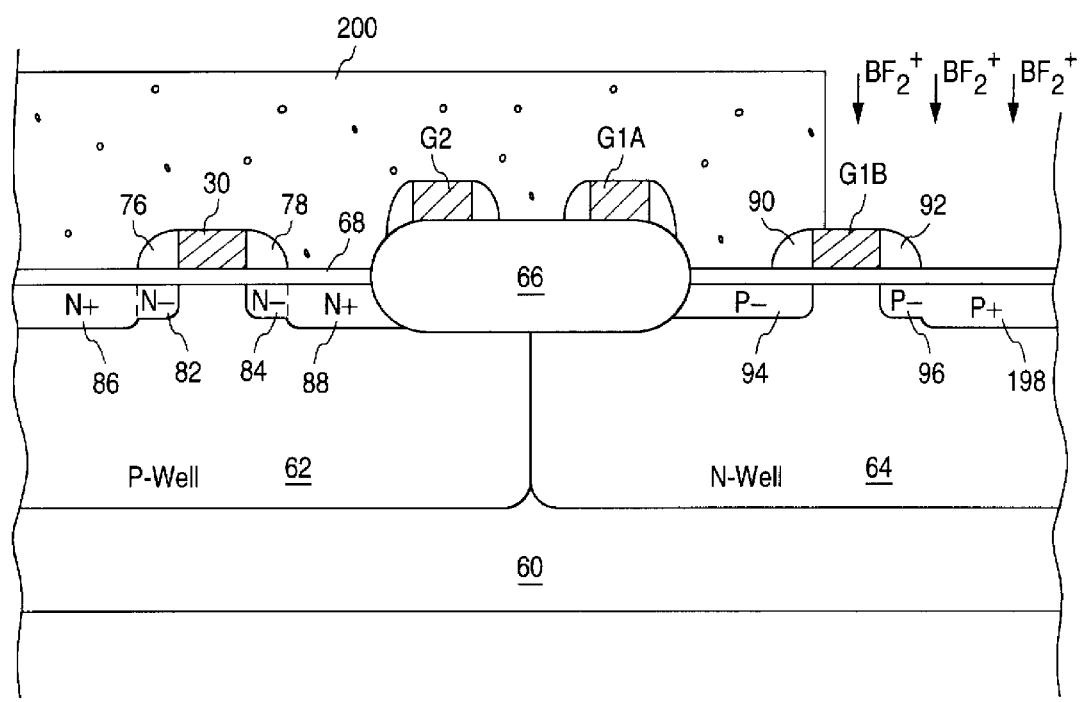
FIG. 14 is a cross-sectional view of an SRAM cell during its fabrication in accordance with an alternative embodiment of the present invention.

In accordance with the present invention, a 6-T SRAM cell in which the PMOS pullup transistors each have only one continuous lightly doped source/drain region is fabricated. In this embodiment, the structure illustrated in FIG. 11 is fabricated as discussed above. After the N type impurities are implanted to form heavily doped N+ source/drain regions 86, 88 as illustrated in FIG. 11, masking layer 130 is removed. Referring now to FIG. 14, a masking layer of suitable material, typically photoresist, is deposited and patterned to form a masking layer 200. Masking layer 200 is formed over P-well 62 and P– source/drain region 94.

After masking layer 200 is formed, P type impurities, illustrated as BF$_2^+$, are implanted into portions of N-well 64 to form heavily doped P+ source/drain region 198 in N-well 64. For example, BF$_2^+$ is implanted with a dosage of $5\times10^{14}$ atoms/cm$^2$ and an energy of 70 keV. The P type impurities are implanted with an energy insufficient to pass the P type impurities through section G1B or through the thicker portions of sidewall spacer 92 and into the underlying portion of N-well 64. (Depending upon the energy used, the P type impurities may not pass through any portion of sidewall spacer 92.) Thus P+ source/drain region 198 is laterally aligned (self-aligned) with sidewall spacer 92. Masking layer 200 is then removed. The remainder, i.e. contacts, insulating layers and interconnect layers, of the SRAM cell is then fabricated using conventional techniques. Referring to FIG. 13, similar masking and implantation techniques (with the exception that N type impurities are implanted instead of P type impurities) as those illustrated in FIG. 14 can be used to form a heavily doped N+ source/drain region 197 (as indicated by the dashed line) of NMOS transistor N110.

Although the present invention has been described with reference to preferred embodiments, persons skilled in the art will recognize that changes may be made in form and detail without departing from the spirit and scope of the invention.

For example, instead of fabricating a single port SRAM cell as described above, a multiport SRAM cell such as a dual port or quadruple port SRAM cell can be fabricated in accordance with the present invention. Further, a SRAM cell in accordance with the present invention can be used in a variety of applications, for example can be used in a first level cache memory, i.e. can be used in a memory integrated on the same chip with the processor.

Further, it is understood that SRAM cell 20 (FIG. 3) can have other layouts. For example, instead of having an angled section G1B of gate G1, section G1B can be a straight section as indicated by the dashed area 132. In this embodiment, gate G2 would also have a straight section as indicated by dashed area 134. Further, although certain dopant concentrations for various semiconductor regions have been set forth, it is understood that these dopant concentrations are illustrative and that the semiconductor regions can have other dopant concentrations.

Thus, the invention is limited only by the following claims.

I claim:

1. A method of fabricating a static random access memory (SRAM) cell comprising the steps of:

providing a semiconductor substrate having first semiconductor regions with a first conductivity type and second semiconductor regions having a second conductivity type opposite said first conductivity type;

forming first gates over portions of said first semiconductor regions and second gates over portions of said second semiconductor regions;

implanting a second conductivity type impurity into portions of said first semiconductor regions to form source regions and drain regions of first and second metal oxide semiconductor (MOS) transistors in said first semiconductor regions, said source regions and said drain regions having said second conductivity type, wherein said first semiconductor regions have a first dopant concentration, wherein said source regions and said drain regions have a second dopant concentration and wherein said second dopant concentration is in the range of said first dopant concentration to 2.5 times said first dopant concentration;

implanting a first conductivity type impurity into portions of said second semiconductor regions to form third semiconductor regions and fourth semiconductor regions, wherein third and fourth MOS transistors comprise said third semiconductor regions and said fourth semiconductor regions; and coupling said first MOS transistor between a first voltage source and a first node of said SRAM cell, said second MOS transistor between said first voltage source and a second node of said SRAM cell, said third MOS transistor between said first node and a second voltage source, said fourth MOS transistor between said second node and said second voltage source, gates of said first and third MOS transistors to said second node and gates of said second and fourth MOS transistors to said first node.

2. A method as in claim 1 further comprising the steps of:

forming a first masking layer over said first semiconductor regions prior to said step of implanting a first conductivity type impurity into portions of said second semiconductor regions to form third semiconductor regions and fourth semiconductor regions;

removing said first masking layer;

forming a second masking layer over said second semiconductor regions prior to said step of implanting a second conductivity type impurity into portions of said first semiconductor regions to form source regions and drain regions; and removing said second masking layer.

3. A method as in claim 1 wherein said first semiconductor regions are N-wells, said second semiconductor regions are P-wells, said second conductivity type is P type and said first conductivity type is N type further comprising the steps of:

forming a masking layer over said P-wells and said N-wells; and performing an implantation with a P type impurity to form heavily doped source/drain regions having dopant concentrations equal to or greater than $1\times10^{18}$ atoms/cm$^3$ of devices formed in said semiconductor substrate which are external to said SRAM cell.

4. A method as in claim 1 further comprising the steps of:

forming sidewall spacers adjacent edges of said first gates and said second gates;

forming a first masking layer over said first semiconductor regions; and implanting a first conductivity type impurity into portions of said second semiconductor regions to form fifth semiconductor regions and sixth semiconductor regions.

5. A method as in claim 4 wherein said fifth semiconductor regions are laterally aligned with first ones of said sidewall spacers formed adjacent first edges of said second gates and wherein said sixth semiconductor regions are laterally aligned with second ones of said sidewall spacers formed adjacent second edges of said second gates.

6. A method as in claim 4 wherein said step of implanting a first conductivity type impurity into portions of said second semiconductor regions to form third semiconductor regions and fourth semiconductor regions comprising implanting phosphorus.

7. A method as in claim 5 wherein said step of implanting a first conductivity type impurity into portions of said second semiconductor regions to form fifth semiconductor regions and sixth semiconductor regions comprising implanting phosphorus.

8. A method as in claim 4 further comprising the steps of:

removing said first masking layer;

forming a second masking layer over said second semiconductor regions and said drain regions; and implanting a second conductivity type impurity into portions of said first semiconductor regions to form seventh semiconductor regions, said seventh semiconductor regions forming heavily doped portions of said source regions with a dopant concentration greater than said second dopant concentration, said seventh semiconductor regions being laterally aligned with sidewall spacers adjacent first edges of said first gates.

9. A method as in claim 1 wherein said third semiconductor regions are laterally aligned with first edges of said second gates and wherein said fourth semiconductor regions are laterally aligned with second edges of said second gates.

10. A method as in claim 1 wherein said step of implanting a second conductivity type impurity into portions of said first semiconductor regions to form source regions and drain regions is performed with a blanket second conductivity type impurity implant.

11. A method as in claim 10 further comprising, prior to said step of implanting a first conductivity type impurity into portions of said second semiconductor regions to form third semiconductor regions and fourth semiconductor regions, the step of forming a first masking layer over said first semiconductor regions.

12. A method as in claim 11 further comprising, prior to said step of implanting a second conductivity type impurity into portions of said first semiconductor regions to form source regions and drain regions, the step of removing said first masking layer.

13. A method as in claim 1 wherein said step of implanting a first conductivity type impurity into portions of said second semiconductor regions to form third semiconductor regions and fourth semiconductor regions is performed with a blanket first conductivity type impurity implant.

14. A method as in claim 13 further comprising, prior to said step of implanting a second conductivity type impurity into portions of said first semiconductor regions to form source regions and drain regions, the step of forming a first masking layer over said second semiconductor regions.

15. A method as in claim 14 further comprising, prior to said step of implanting a first conductivity type impurity into portions of said second semiconductor regions to form third semiconductor regions and fourth semiconductor regions, the step of removing said first masking layer.

16. A method as in claim 1 wherein said step of implanting a second conductivity type impurity into portions of said first semiconductor regions to form source regions and drain regions comprising implanting boron diflouride ions ($BF_2^+$).

17. A method as in claim 16 wherein said source regions and said drain regions are continuous lightly doped semiconductor regions, said first and second MOS transistors having an absence of heavily doped portions of source regions or drain regions with dopant concentrations greater than 2.5 times said first dopant concentration.

18. A method as in claim 1 wherein said source regions are laterally aligned with first edges of said first gates and wherein said drain regions are laterally aligned with second edges of said first gates.

* * * * *